(12) United States Patent
Liang et al.

(10) Patent No.: US 10,930,827 B2
(45) Date of Patent: Feb. 23, 2021

(54) FLUORORESIN INTERFACIAL AGENT FOR LED PACKAGING, AND METHODS FOR PREPARING AND USING SAME

(71) Applicants: EZHOU INSTITUTE OF INDUSTRIAL TECHNOLOGY, HUAZHONG UNIVERSITY OF SCIENCE AND TECHNOLOGY, Ezhou (CN); HUAZHONG UNIVERSITY OF SCIENCE AND TECHNOLOGY, Wuhan (CN)

(72) Inventors: Renli Liang, Wuhan (CN); Linlin Xu, Wuhan (CN); Jingwen Chen, Wuhan (CN); Shuai Wang, Wuhan (CN); Jun Zhang, Wuhan (CN); Shida Du, Wuhan (CN)

( * ) Notice: Subject to any disclaimer, the term of this patent is extended or adjusted under 35 U.S.C. 154(b) by 0 days.

(21) Appl. No.: 16/338,629

(22) PCT Filed: Nov. 22, 2017

(86) PCT No.: PCT/CN2017/112290
§ 371 (c)(1),
(2) Date: Apr. 1, 2019

(87) PCT Pub. No.: WO2019/000816
PCT Pub. Date: Jan. 3, 2019

(65) Prior Publication Data
US 2020/0109322 A1  Apr. 9, 2020

(30) Foreign Application Priority Data
Jun. 29, 2017  (CN) .......................... 201710515884.8

(51) Int. Cl.
*H01L 21/469* (2006.01)
*H01L 21/00* (2006.01)
(Continued)

(52) U.S. Cl.
CPC .............. *H01L 33/56* (2013.01); *H01L 33/58* (2013.01)

(58) Field of Classification Search
CPC ....................................................... H01L 33/56
(Continued)

(56) References Cited

U.S. PATENT DOCUMENTS 9,327,985 B2 * 5/2016 Fugetsu .................. C01B 32/23

FOREIGN PATENT DOCUMENTS

| CN | 104829988 A | 8/2015 |
|---|---|---|
| CN | 107337881 A | 11/2017 |

(Continued)

OTHER PUBLICATIONS

First Office Action in Foreign Priority Application (CN 201710515884.8 filed Jun. 29, 2017).

*Primary Examiner* — Calvin Lee
(74) *Attorney, Agent, or Firm* — Chang & Hale LLP (57) ABSTRACT

Disclosed are a fluororesin interfacial agent for LED packaging, and a method for preparing and using the same. The fluororesin interfacial agent for LED packaging comprises a graphene oxide fluororesin sealant and KH550 silane coupling agent solution. Graphene oxide powder in the graphene oxide fluororesin sealant chemically reacts with the KH550 silane coupling agent, and molecular crosslinking is formed, which tightly fixes a bonding interface and a fluororesin matrix like countless molecular anchors, and which greatly improves the bonding capability of fluororesin sealant and ensures the reliability of LED packaging.

11 Claims, 4 Drawing Sheets

(51) Int. Cl.
*H01L 33/56* (2010.01)
*H01L 33/58* (2010.01)

(58) Field of Classification Search
USPC .......................... 438/124–127; 257/788–795
See application file for complete search history.

(56) References Cited

FOREIGN PATENT DOCUMENTS

| | | |
|---|---|---|
| WO | 2011096370 A1 | 8/2011 |
| WO | 2012133557 A1 | 10/2012 |
| WO | 2014057858 A1 | 4/2014 |

\* cited by examiner

Fig. 6

FLUORORESIN INTERFACIAL AGENT FOR LED PACKAGING, AND METHODS FOR PREPARING AND USING SAME

TECHNICAL FIELD

The present disclosure generally relates to a field of interfacial agent for LED packaging, and more particularly, to a fluororesin interfacial agent for LED packaging, and a method for preparing and a method for using the same.

BACKGROUND

A deep ultraviolet LED based on an AlGaN material has a broad application prospect in the fields of sterilization, confidential communication, biochemical detection and special lighting, and has received more and more concern and attention in recent years. Currently, a thermosetting epoxy resin and an organosiloxane resin are widely used as a sealant material for a LED device. These sealant resins are directly spotted on a chip and cured to form a solid sealant. However, it is easy for an organic phase in such a conventional Si—O-based packaging material to absorb ultraviolet rays, which causes them a poor transmittance and an easy photolysis failure, which makes them unsuitable for a field of packaging material of ultraviolet LED, especially deep ultraviolet LED. Therefore, fluoropolymer based on C—F has attracted extensive attention. Yamada Kiwa (山田喜和) et al. manufactured S-type polymerized perfluoro-4-vinyloxy-1-butene with stable end (—CF3), which proves that S-type fluoropolymer has excellent ultraviolet transmittance, strong ultraviolet stability and plays an important role in improving the performance of the deep ultraviolet LED. However, the application of fluoropolymer with poor adhesive capacity in a deep ultraviolet LED sandwich structure (Chip-Sealant-Quartz Lens) has great difficulties, and the formative air barrier greatly affects the light output power and heat transfer of the deep ultraviolet LED, which causes oxygen and water vapor in the external environment to erode the chip, which renders the failure of the deep ultraviolet LED.

In order to push and promote the wide application of deep ultraviolet LED light sources, an interface agent with strong bonding capability is needed.

SUMMARY

The purpose of the present disclosure is to solve one of the technical defects existing in the prior art, and provide a fluororesin interfacial agent for LED packaging, which comprises a graphene oxide fluororesin sealant and a KH550 silane coupling agent solution. Graphene oxide powder in the graphene oxide fluororesin sealant chemically reacts with the KH550 silane coupling agent, and molecular cross-linking is formed, which tightly fixes a bonding interface and a fluororesin matrix like countless molecular anchors, and which greatly improves the bonding capability of fluororesin sealant and ensures the reliability of LED packaging.

In order to realize the above purpose, the following technical solution is adopted:

A fluororesin interfacial agent for LED packaging, comprising: a graphene oxide fluororesin sealant and a KH550 silane coupling agent solution, the graphene oxide fluororesin sealant being composed of a graphene oxide dispersion liquid and a fluororesin matrix; the KH550 silane coupling agent solution is composed of a deionized water solution and a KH550 silane coupling agent.

As a preference of the above solution, the graphene oxide dispersion liquid is composed of graphene oxide powder and anhydrous ethanol.

As a preference of the above solution, the deionized water solution is composed of deionized water and anhydrous ethanol.

The present disclosure also provides a method for preparing a fluororesin interfacial agent for LED packaging, comprising:

(1) preparing a graphene oxide fluororesin sealant, comprising: firstly adding a graphene oxide dispersion liquid into a centrifuge tube filled with a fluororesin matrix, and stirring to obtain a mixture A of the graphene oxide dispersion liquid and the fluororesin matrix, then putting the mixture A of the graphene oxide dispersion liquid and the fluororesin matrix into a centrifuge to centrifugally stratify to obtain a mixture B of the graphene oxide and the fluororesin matrix, and further stirring the mixture B of the graphene oxide and the fluororesin matrix to obtain the graphene oxide fluororesin sealant;

(2) preparing a silane coupling agent solution, comprising: adding a KH550 silane coupling agent into a deionized water solution, and ultrasonically vibrating to prepare a silane coupling agent solution.

As a preference of the above solution, the method for preparing the graphene oxide dispersion liquid comprises: firstly, ball milling and grinding graphene oxide powder by a ball mill, then adding the graphene oxide powder into anhydrous ethanol and ultrasonically vibrating to obtain the graphene oxide dispersion liquid.

As a preference of the above solution, naturally open-air drying anhydrous ethanol in the mixture B of the graphene oxide and the fluororesin matrix before stirring the mixture B of the graphene oxide and the fluororesin matrix obtained after the centrifugal stratification.

As a preference of the above solution, the method for preparing the deionized water solution comprises: adding deionized water into anhydrous ethanol, and ultrasonically vibrating to prepare the deionized water solution.

The present disclosure further provides a method for using a fluororesin interfacial agent for LED packaging, comprising:

(1) applying the KH550 silane coupling agent solution in any one of the above fluororesin interfacial agent for LED packaging onto a surface of a LED chip and a bottom of a quartz lens, and baking the LED chip and the quartz lens after evenly applying;

(2) applying the graphene oxide fluororesin sealant in any one of the above fluororesin interfacial agent for LED packaging onto the surface of LED chip, and vacuum defoaming;

(3) adding a quartz lens and adjusting the quartz lens to the center of the LED chip to form an LED packaging;

(4) baking the LED packaging in an oven.

BRIEF DESCRIPTION OF THE DRAWINGS

In order to more clearly illustrate embodiments of the present disclosure or technical solutions in the prior art, drawings used in the description of embodiments or the prior art will be briefly described below, obviously, the drawings in the following description are only some embodiments of the present disclosure, for those ordinary skilled in the art, other drawings may be obtained according to these drawings without paying inventive labor.

FIG. 6 is a contrastive graph of light attenuation accelerated aging test of an existing LED packaging with a fluororesin matrix and a LED packaging processed by the interfacial agent provided by the present disclosure, wherein 1 is a curve of light attenuation accelerated aging test of a LED packaging by the fluororesin matrix without doping the graphene oxide, 2 is a curve of light attenuation accelerated aging test of a LED packaging processed by an interfacial agent containing 0.05 wt % of a graphene oxide fluororesin sealant provided by the present disclosure, 3 is a curve of light attenuation accelerated aging test of an LED packaging processed by an interfacial agent containing 0.1 wt % of the graphene oxide fluororesin sealant provided by the present disclosure, 4 is a curve of light attenuation accelerated aging test of an existing LED packaging processed by an interfacial agent containing 0.2 wt % of the graphene oxide fluororesin sealant provided by the present disclosure.

DESCRIPTION OF EMBODIMENTS

The technical solutions of the present disclosure will be clearly and completely described in conjunction with the drawings of the present disclosure, and it is obvious that the described embodiments are only a portion of the embodiments of the present disclosure but not all of the embodiments. All other embodiments obtained by those skilled of the art based on the embodiments of the present disclosure without paying inventive labor are within the scope of protection in the present disclosure.

Embodiment 1

The present embodiment provides a fluororesin interfacial agent for LED packaging, which comprises a 0.05 wt % of graphene oxide fluororesin sealant and a 1 wt % of KH550 silane coupling agent solution, the 0.05 wt % of graphene oxide fluororesin sealant being composed of 2 mg/mL of graphene oxide dispersion liquid and a fluororesin matrix, the 2 mg/mL of graphene oxide dispersion liquid being composed of a graphene oxide powder and anhydrous ethanol; the 1 wt % of KH550 silane coupling agent solution being composed of 5 wt % of a deionized water solution and the KH550 silane coupling agent, the 5 wt % of deionized water solution being composed of deionized water and anhydrous ethanol.

Further, the fluororesin matrix is a polymerized perfluoro-4-vinyloxy-1-butene having a —CF3 terminal, which is polymerized from inorganic molecules containing fluorine element, and has features of high ultraviolet transmittance, excellent ultraviolet irradiation stability, good waterproof and oxygen resistance function, poor adhesion and the like.

Further, the graphene oxide powder is prepared by a Hummers method, and has a typical quasi-two-dimensional structure and a plurality of oxygen-containing groups on its lamellar, furthermore it has high specific surface energy, good hydrophilicity, high thermal conductivity, mechanical property and barrier effect, and it is an ideal composite doping material.

Furthermore, the used KH550 silane coupling agent comprises two different active groups, i.e. an amino group and an oxygen group in molecule thereof, which are used to couple organic polymer and inorganic filler.

Figure 1:
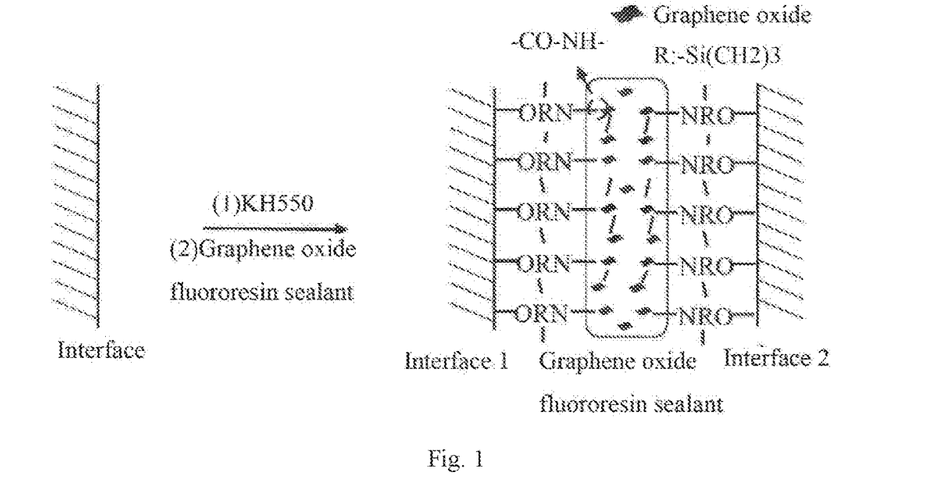
FIG. 1 is a principle schematic diagram of anchorage structure formed by a reaction between graphene oxide powder in a graphene oxide fluororesin sealant and a KH550 silane coupling agent in a fluororesin interfacial agent for LED packaging provided according to the present disclosure.
Figure 2:
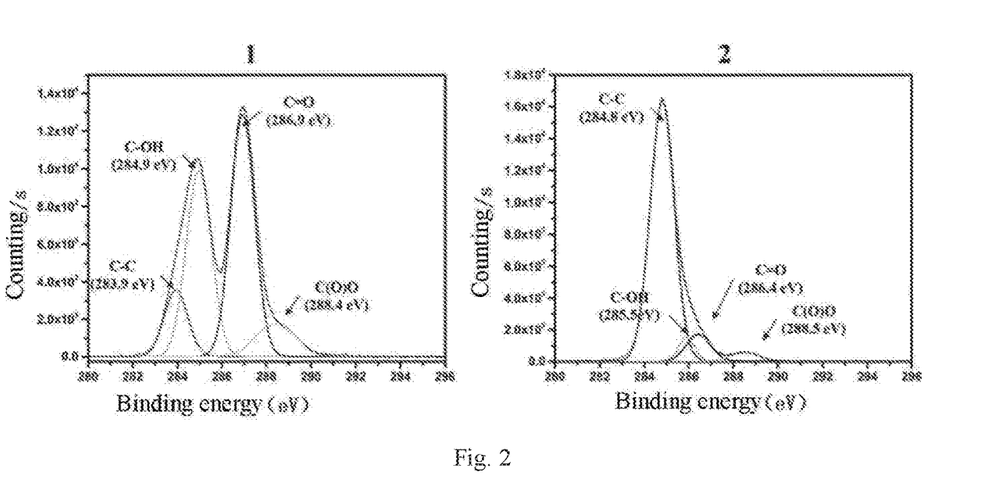
FIG. 2 is a contrastive schematic diagram of C1s photoelectron spectroscopy of graphene oxide powder and graphene oxide powder modified by a KH550 silane coupling agent, wherein 1 is a C1s photoelectron spectroscopy diagram of the graphene oxide powder, 2 is a C1s photoelectron spectroscopy diagram of the graphene oxide powder modified by the KH550 silane coupling agent.
Figure 3:
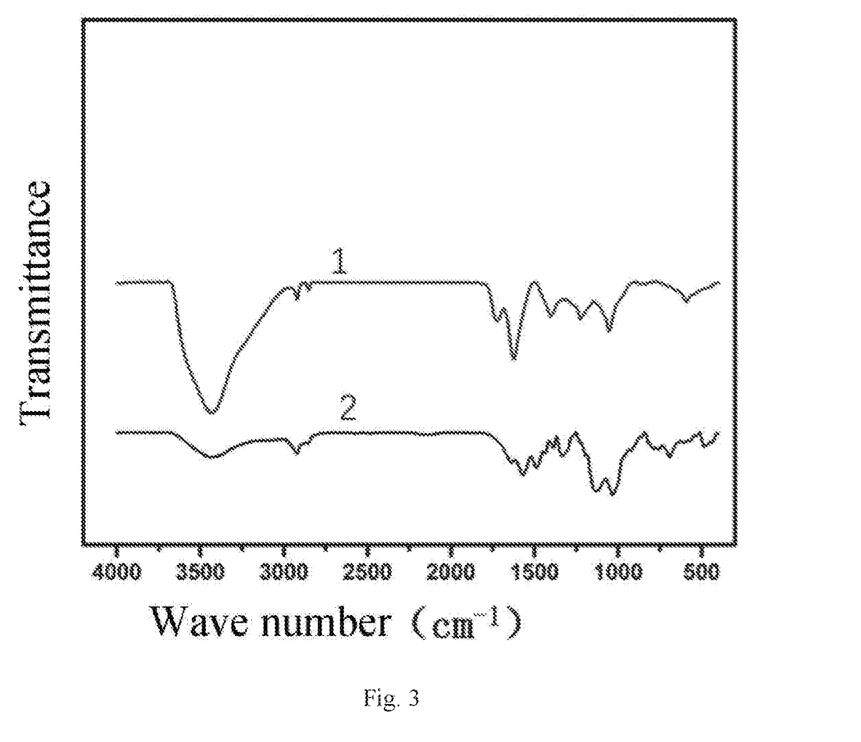
FIG. 3 is a contrastive schematic diagram of infrared spectrum of graphene oxide powder and graphene oxide powder modified by a KH550 silane coupling agent, wherein 1 is an infrared spectrum diagram of the graphene oxide powder, 2 is an infrared spectrum diagram of the graphene oxide powder modified by the KH550 silane coupling agent.

FIG. 1 shows the principle of a reaction between the graphene oxide powder and the KH550 silane coupling agent, wherein a chemical reaction occurs between the two and forms molecular crosslinking to tightly fix the bonding interface and fluororesin matrix together like countless molecular anchors, which greatly improves the bonding capability of fluororesin sealant and ensures the reliability of LED packaging. FIG. 2 is a contrastive schematic diagram of C1s photoelectron spectroscopy, FIG. 3 is a contrastive schematic diagram of infrared spectrum. FIG. 2 and FIG. 3 prove that a chemical reaction may occur between the graphene oxide powder and the KH550 silane coupling agent in fact, and provide a factual basis for the theory of FIG. 1.

Figure 4:
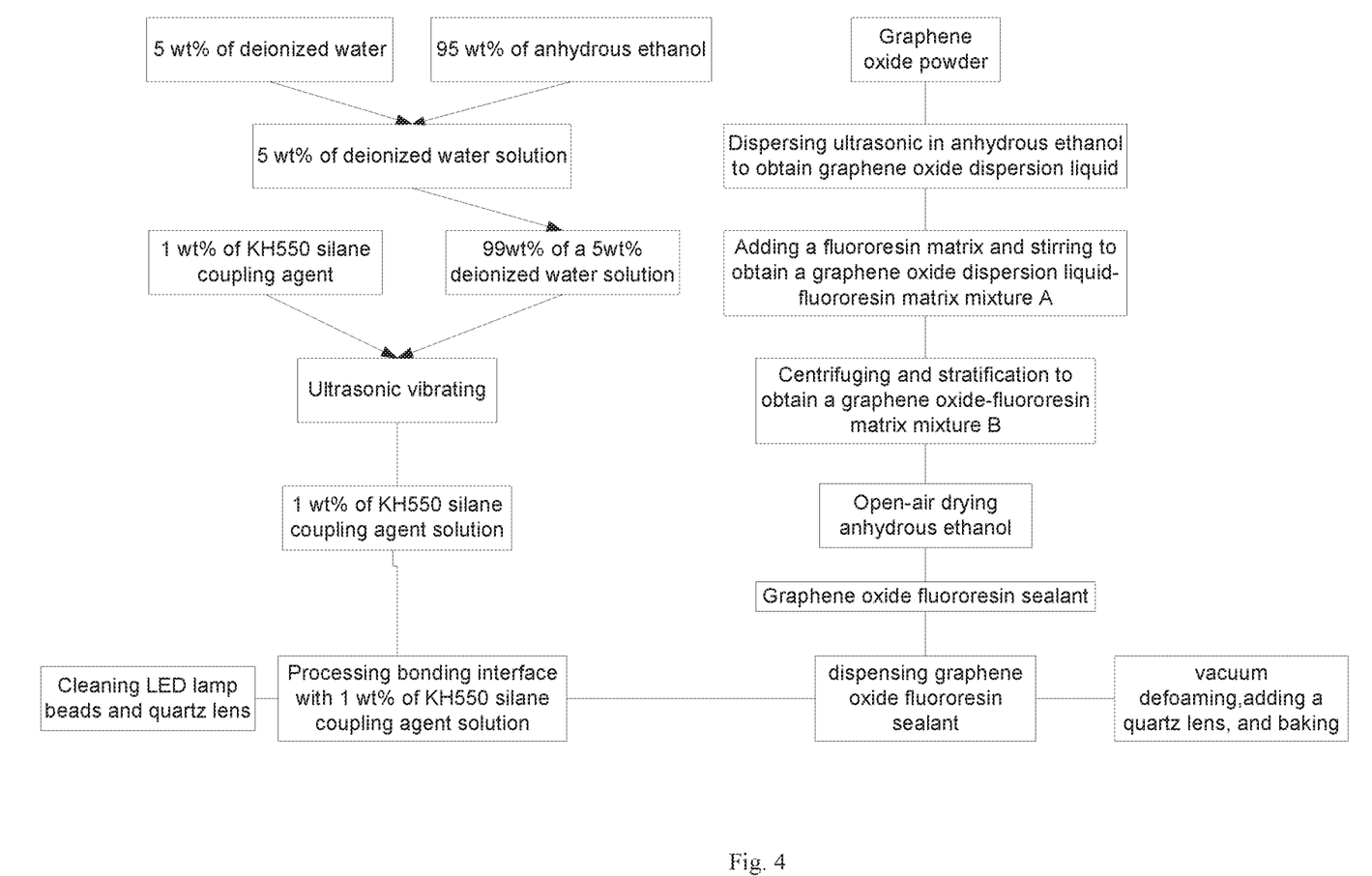
FIG. 4 is a process flow diagram according to an embodiment of the present disclosure.

As shown in FIG. 4, the present embodiment also provides a method for preparing a fluororesin interfacial agent for LED packaging, comprising:

(1) Preparing a graphene oxide fluororesin sealant, comprising: firstly ball milling and grinding graphene oxide powder by a ball mill, adding a certain weight of graphene oxide powder into anhydrous ethanol, and proportioning 2 mg/mL of graphene oxide dispersion liquid after 1 hour of ultrasonic vibration; then adding the 2 mg/mL of graphene oxide dispersion liquid into a centrifuge tube filled with a fluororesin matrix and stirring with a glass rod for 15 minutes to obtain a mixture A of the graphene oxide dispersion liquid and the fluororesin matrix, then putting the mixture A of the graphene oxide dispersion liquid and the fluororesin matrix into a centrifuge, obtaining a mixture B of the graphene oxide and the fluororesin matrix after setting a revolution to 10000 to perform a centrifugal stratification, naturally drying anhydrous ethanol in the mixture B of the graphene oxide and the fluororesin matrix, and further stirring the remaining liquid for 1 hour to obtain 0.05 wt % of graphene oxide fluororesin sealant;

(2) preparing a silane coupling agent solution, comprising: firstly adding deionized water into anhydrous ethanol and ultrasonically vibrating to prepare a 5 wt % of deionized water solution, then adding a KH550 silane coupling agent into the 5 wt % of deionized water solution and ultrasonically vibrating to prepare a 1 wt % of KH550 silane coupling agent solution.

Figure 5:
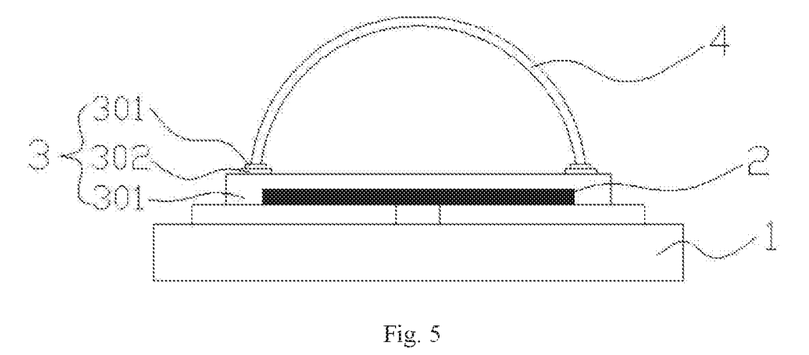
FIG. 5 is a structural schematic diagram of an OLED packaging processed by a fluororesin interfacial agent for LED packaging provided by the present disclosure.

As shown in FIG. 4, the present disclosure also provides a method for using a fluororesin interfacial agent for LED packaging, comprising:

(1) ultrasonically cleaning a quartz lens and an LED chip without the quartz lens;

(2) dripping a 1 wt % of KH550 silane coupling agent solution in the fluororesin interfacial agent for LED packaging onto a surface of the LED chip and a bottom of the quartz lens, and baking the LED chip and the quartz lens at 80° C. for 5 minutes after evenly applying;

(3) spotting a 0.05 wt % of a graphene oxide fluororesin sealant in the fluororesin interfacial agent for LED packaging on the surface of the LED chip by a glue dispenser, and vacuum defoaming for 10 minutes;

(4) adding the quartz lens and adjusting the quartz lens to a center of the LED chip to form an LED packaging;

(5) baking the LED packaging in an oven, setting a baking temperature at 80° C. and a reaction time as 12 hours, and then preparing a LED packaging product shown in FIG. 5.

As shown in FIG. 5, the LED packaging product comprises a substrate 1, a chip 2, a packaging interfacial agent 3 and quartz glass 4, wherein the packaging interfacial agent 3 is a fluororesin interfacial agent for LED packaging provided by the present disclosure which comprises a 0.05 wt % of graphene oxide fluororesin sealant 302 and a 1 wt % of KH550 silane coupling agent solution 301.

Embodiment 2

The present embodiment provides a fluororesin interfacial agent for LED packaging, which comprises a 0.1 wt % of graphene oxide fluororesin sealant and 1 wt % of KH550 silane coupling agent solution, the 0.1 wt % of graphene oxide fluororesin sealant being composed of 2 mg/mL of graphene oxide dispersion liquid and a fluororesin matrix, the 2 mg/mL of graphene oxide dispersion liquid being composed of graphene oxide powder and anhydrous ethanol; the 1 wt % of KH550 silane coupling agent solution being composed of 5 wt % of deionized water solution and a KH550 silane coupling agent, the 5 wt % of deionized water solution being composed of deionized water and anhydrous ethanol.

Further, the fluororesin matrix is polymerized perfluoro-4-vinyloxy-1-butene having a —CF3 terminal, which is polymerized from inorganic molecules containing fluorine element, and has features of high ultraviolet transmittance, excellent ultraviolet irradiation stability, good waterproof and oxygen resistance function, poor adhesion and the like.

Further, the graphene oxide powder is prepared by a Hummers method, and has a typical quasi-two-dimensional structure and a plurality of oxygen-containing groups on its lamellar, further has high specific surface energy, good hydrophilicity, high thermal conductivity, mechanical property and barrier effect, and it is an ideal composite doping material.

Furthermore, the used KH550 silane coupling agent comprises two different active groups, i.e. an amino group and an oxygen group in molecule thereof, which are used to couple organic polymer and inorganic filler.

As shown in FIG. 4, the present embodiment also provides a method for preparing a fluororesin interfacial agent for LED packaging, comprising:

(1) preparing a graphene oxide fluororesin sealant, in which firstly graphene oxide powder is ball milled and grounded by a ball mill, and a certain weight of graphene oxide powder is added into anhydrous ethanol to proportion 2 mg/mL of graphene oxide dispersion liquid after 1 hour of ultrasonic vibration; then the 2 mg/mL of graphene oxide dispersion liquid is added into a centrifuge tube filled with a fluororesin matrix, stirring with a glass rod for 15 minutes to obtain a mixture A of the graphene oxide dispersion liquid and the fluororesin matrix, then putting the mixture A of the graphene oxide dispersion liquid and the fluororesin matrix into a centrifuge, setting a revolution to 10000 to perform a centrifugal stratification and obtaining a mixture B of the graphene oxide and the fluororesin matrix, naturally drying anhydrous ethanol in the mixture B of the graphene oxide-fluororesin matrix, and further stirring the remaining liquid for 1 hour to obtain 0.1 wt % of graphene oxide fluororesin sealant;

(2) preparing a silane coupling agent solution, in which firstly deionized water is added into anhydrous ethanol and ultrasonically vibrating to prepare a 5 wt % of deionized water solution, then adding a KH550 silane coupling agent into the 5 wt % of deionized water solution and ultrasonically vibrating to prepare a 1 wt % of KH550 silane coupling agent solution.

As shown in FIG. 4, the present disclosure further provides a method for using a fluororesin interfacial agent for LED packaging, comprising:

(1) ultrasonically cleaning a quartz lens and an LED chip without the quartz lens;

(2) dripping 1 wt % of KH550 silane coupling agent solution in the fluororesin interfacial agent for LED packaging on a surface of the LED chip and a bottom of the quartz lens, and baking the LED chip and the quartz lens at 80° C. for 5 minutes after evenly applying;

(3) spotting a 0.1 wt % of graphene oxide fluororesin sealant in the fluororesin interfacial agent for LED packaging on the surface of the LED chip by a glue dispenser, and vacuum defoaming for 10 minutes;

(4) adding the quartz lens and adjusting the quartz lens to the center of the LED chip to form an LED packaging;

(5) baking the LED packaging in an oven at a set baking temperature 80° C. for a reaction time 12 hours, then preparing a LED packaging product shown in FIG. 5.

As shown in FIG. 5, the LED packaging product comprises a substrate 1, a chip 2, a packaging interfacial agent 3 and quartz glass 4, wherein the packaging interfacial agent 3 is the fluororesin interfacial agent for LED packaging provided by the present disclosure which comprises a 0.1 wt % of graphene oxide fluororesin sealant 302 and a 1 wt % of KH550 silane coupling agent solution 301.

Embodiment 3

The present embodiment provides a fluororesin interfacial agent for LED packaging, which comprises a 0.2 wt % of graphene oxide fluororesin sealant and a 1 wt % of KH550 silane coupling agent solution, the 0.2 wt % of graphene oxide fluororesin sealant being composed of 2 mg/mL of graphene oxide dispersion liquid and a fluororesin matrix, the 2 mg/mL of graphene oxide dispersion liquid being composed of graphene oxide powder and anhydrous ethanol; the 1 wt % of KH550 silane coupling agent solution being composed of a 5 wt % of deionized water solution and a KH550 silane coupling agent, the 5 wt % of deionized water solution being composed of deionized water and anhydrous ethanol.

Further, the fluororesin matrix is a polymerized perfluoro-4-vinyloxy-1-butene having a —CF3 terminal, which is polymerized from inorganic molecules containing fluorine element, and has features of high ultraviolet transmittance, excellent ultraviolet irradiation stability, good waterproof and oxygen resistance function, poor adhesion and the like.

Further, the graphene oxide powder is prepared by a Hummers method and has a typical quasi-two-dimensional structure, and a plurality of oxygen-containing groups on its lamellar, further has high specific surface energy, good hydrophilicity, high thermal conductivity, mechanical property and barrier effect, and it is an ideal composite doping material.

Furthermore, the used KH550 silane coupling agent comprises two different active groups, i.e. an amino group and an oxygen group in molecule thereof, which are used to couple organic polymer and inorganic filler.

As shown in FIG. 4, the present embodiment also provides a method for preparing a fluororesin interfacial agent for LED packaging, comprising:

(1) preparing a graphene oxide fluororesin sealant, comprising: firstly ball milling and grinding graphene oxide powder by a ball mill, and adding a certain weight of the graphene oxide powder into anhydrous ethanol to proportion 2 mg/mL of graphene oxide dispersion liquid after 1 hour of ultrasonic vibration; then adding the 2 mg/mL of graphene oxide dispersion liquid into a centrifuge tube filled with a fluororesin matrix, stirring with a glass rod for 15 minutes to obtain a mixture A of the graphene oxide dispersion liquid and the fluororesin matrix, then putting the mixture A of the graphene oxide dispersion liquid and the fluororesin matrix into a centrifuge, setting a revolution to 10000 to centrifugally stratify and obtaining a mixture B of the graphene oxide and the fluororesin matrix, naturally drying anhydrous ethanol in the mixture B of the graphene oxide and the fluororesin matrix, and further stirring the remaining liquid for 1 hour to obtain a 0.2 wt % of graphene oxide fluororesin sealant;

(2) preparing a silane coupling agent solution, comprising: firstly adding deionized water into anhydrous ethanol and ultrasonically vibrating to prepare a 5 wt % of deionized water solution, then adding a KH550 silane coupling agent into the 5 wt % of deionized water solution and ultrasonically vibrating to prepare a 1 wt % of KH550 silane coupling agent solution.

As shown in FIG. 4, the present disclosure further provides a method for using a fluororesin interfacial agent for LED packaging, comprising:

(1) ultrasonically cleaning a quartz lens and a LED chip without the quartz lens;

(2) dripping a 1 wt % of KH550 silane coupling agent solution in the fluororesin interfacial agent for LED packaging onto a surface of the LED chip and a bottom of the quartz lens, and baking the LED chip and the quartz lens at 80° C. for 5 minutes after evenly applying;

(3) spotting a 0.1 wt % of graphene oxide fluororesin sealant in the fluororesin interfacial agent for LED packaging onto the surface of the LED chip by a glue dispenser, and vacuum defoaming for 10 minutes;

(4) adding a quartz lens and adjusting the quartz lens to the center of the LED chip to form an LED packaging;

(5) baking the LED packaging in an oven at a set baking temperature 80° C. for a reaction time 12 hours, then preparing a LED packaging product shown in FIG. 5.

As shown in FIG. 5, the LED packaging product comprises a substrate 1, a chip 2, a packaging interfacial agent 3 and quartz glass 4, wherein the packaging interfacial agent 3 is the fluororesin interfacial agent for LED packaging provided by the present disclosure which comprises a 0.1 wt % of graphene oxide fluororesin sealant 302, and a 1 wt % of KH550 silane coupling agent solution 301.

Figure 6:
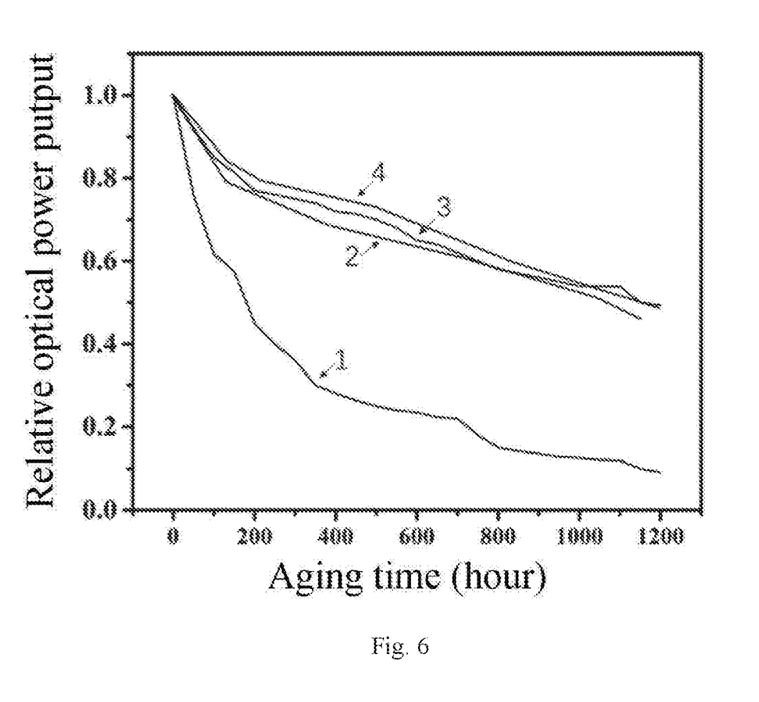

The result of light attenuation accelerated aging test on the LED packaging in the embodiments 1, 2 and 3 and the existing LED packaging processed by the fluororesin matrix is shown in FIG. 6, where 1 is a curve of light attenuation accelerated aging test of an existing LED packaging processed by the fluororesin matrix without doping the graphene oxide, 2 is a curve of light attenuation accelerated aging test of a LED packaging processed by an interfacial agent containing 0.05 wt % of graphene oxide fluororesin sealant provided by the present disclosure, 3 is a curve of light attenuation accelerated aging test of an LED packaging processed by an interfacial agent containing 0.1 wt % of graphene oxide fluororesin sealant provided by the present disclosure, and 4 is a curve of light attenuation accelerated aging test of an LED packaging processed by an interfacial agent containing 0.2 wt % of graphene oxide fluororesin sealant provided by the present disclosure. Thus it can be seen that the anti-aging capability of the LED packaging processed by the interfacial agent provided by the disclosure is obviously enhanced.

The above description is only a specific embodiment of the present disclosure, but the protection scope of the present disclosure is not limited thereto, and any person skilled in the art may easily think of changes or substitutions within the technical scope of the disclosure, and which should be covered within the scope of protection of the present disclosure. Therefore, the protection scope of the present disclosure should be subject to the protection scope of the claims.

What is claimed is:

1. A fluororesin interfacial agent for LED packaging, being a composite coating formed by:
   a graphene oxide fluororesin sealant, which comprises a fluororesin matrix and graphene oxide powder dispersed in the fluororesin matrix; and
   a silane coupling agent solution,
   wherein the graphene oxide powder and the silane coupling agent chemically react and form molecular crosslinking.

2. The fluororesin interfacial agent for LED packaging of claim 1 wherein the fluororesin matrix comprises polymerized perfluoro-4-vinyloxy-1-butene having a -CF3 terminal.

3. The fluororesin interfacial agent for LED packaging of claim 1 wherein the graphene oxide fluororesin sealant further comprises ethanol as a solvent.

4. The fluororesin interfacial agent for LED packaging of claim 1 wherein the silane coupling agent solution comprises a silane coupling agent and water and/or ethanol as a solvent.

5. The fluororesin interfacial agent for LED packaging of claim 4 wherein the silane coupling agent solution comprises y-aminopropyltriethoxysilane (KH550).

6. An LED device, comprising:
   a substrate;
   a LED chip set on the substrate; and
   a lens covering the LED chip,
   wherein the lens is bonded to the substrate through a fluororesin interfacial agent, the fluororesin interfacial agent being a composite coating formed by a graphene oxide fluororesin sealant, and a silane coupling agent between the graphene oxide fluororesin sealant and the substrate and between the graphene oxide fluororesin sealant and a bottom surface of the lens, and
   wherein the graphene oxide fluororesin comprises a fluororesin matrix and graphene oxide powder dispersed in the fluororesin matrix, and the graphene oxide powder and the silane coupling agent chemically react and form molecular crosslinking.

7. The LED device of claim 6 wherein the graphene oxide fluororesin sealant comprises a fluororesin matrix and graphene oxide powder dispersed in the fluororesin matrix, the silane coupling agent and the graphene oxide powder generating a crosslinking reaction.

8. The LED device of claim 6 wherein the fluororesin matrix comprises polymerized perfluoro-4-vinyloxy-1-butene having a -CF3 terminal, and the silane coupling agent solution comprises y-aminopropyltriethoxysilane (KH550).

9. The LED device of claim 6 wherein the LED device is an ultraviolet LED device or a deep ultraviolet LED device.

10. The LED device of claim 6 wherein the silane coupling agent further covers a surface of the LED chip.

11. The LED device of claim 6 wherein the lens is a quartz lens.

* * * * *